United States Statutory Invention Registration [19]

[11] Reg. Number: H566

Nyaiesh et al.

[43] Published: Jan. 3, 1989

[54] APPARATUS AND PROCESS FOR DEPOSITION OF HARD CARBON FILMS

[75] Inventors: Ali R. Nyaiesh, Menlo Park; Edward L. Garwin, Los Altos, both of Calif.

[73] Assignee: The United States of America as represented by the United States Department of Energy, Washington, D.C.

[21] Appl. No.: 804,680

[22] Filed: Dec. 4, 1985

[51] Int. Cl.[4] ..... B05D 3/06; C23C 14/00; C23C 16/00

[52] U.S. Cl. ..... 427/38; 427/113; 118/50.1; 118/723

[58] Field of Search ..... 427/38, 39, 113; 118/50.1, 723

[56] References Cited

U.S. PATENT DOCUMENTS

| | | | |
|---|---|---|---|
| 3,916,034 | 10/1975 | Tsuchimoto | 427/38 |
| 4,382,100 | 5/1983 | Holland | 427/38 |
| 4,563,367 | 1/1986 | Sherman | 118/50.1 |

FOREIGN PATENT DOCUMENTS

| | | | |
|---|---|---|---|
| 59-205470 | 11/1984 | Japan | 118/723 |

*Primary Examiner*—John F. Terapane
*Assistant Examiner*—Susan Wolffe
*Attorney, Agent, or Firm*—Clifton E. 25Clouse, Jr.; Roger S. Gaither; Judson R. Hightower

[57] ABSTRACT

A process and an apparatus for depositing thin, amorphous carbon films having extreme hardness on a substrate is described. An enclosed chamber maintained at less than atmospheric pressure houses the substrate and plasma producing elements. A first electrode is comprised of a cavity enclosed within an RF coil which excites the plasma. A substrate located on a second electrode is excited by radio frequency power applied to the substrate. A magnetic field confines the plasma produced by the first electrode to the area away from the walls of the chamber and focuses the plasma onto the substrate thereby yielding film deposits having higher purity and having more rapid buildup than other methods of the prior art.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

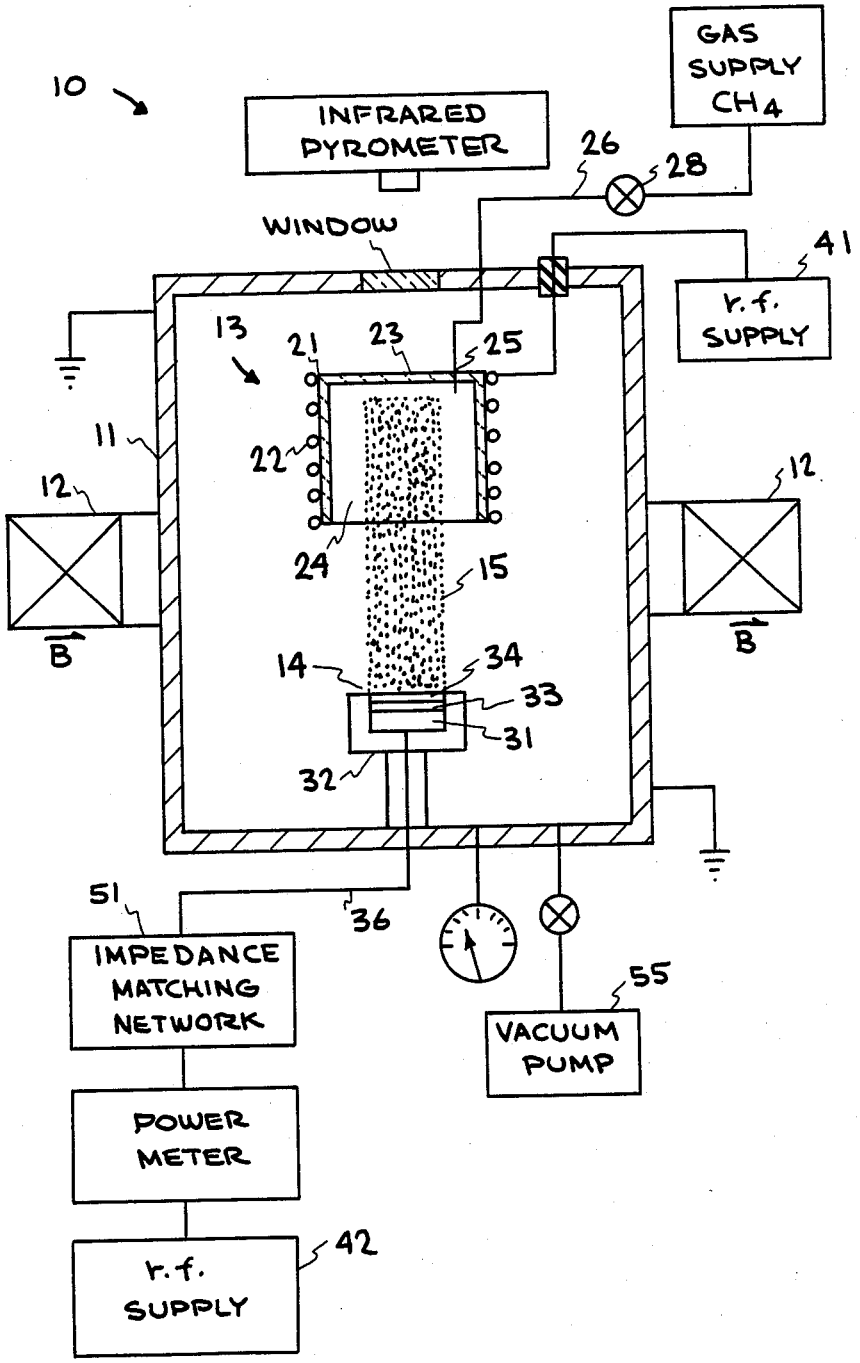
10
INFRARED PYROMETER
GAS SUPPLY CH4
26
28
WINDOW
41
r.f. SUPPLY
13
21
23
25
11
22
12
12
24
15
B
B
14
34
33
31
32
51
36
IMPEDANCE MATCHING NETWORK
55
VACUUM PUMP
POWER METER
r.f. SUPPLY
42

APPARATUS AND PROCESS FOR DEPOSITION OF HARD CARBON FILMS

The Government has rights in this invention pursuant to Contract No. DE-AC03-76SF00515 awarded by the U.S. Department of Energy.

BACKGROUND OF THE INVENTION

1. Field of the Invention

The present invention relates to apparatuses and processes for deposition of films and, in particular, to apparatuses and processes for the deposition of carbon films having extreme hardness, extremely low electrical conductivity, optical transparency, and low internal stress.

2. Prior Art

Amorphous carbon films having diamond-like properties of extreme hardness, extremely low electrical conductivity and low coefficients of friction, and optical transparency over a wide range of wavelengths, have widespread applications as optical coatings, anti-friction and anti-corrosion coatings, and in various other applications such as surface finishing and in semiconductor manufacturing. Methods of applying carbon and other elemental films to surfaces to produce films having the desired qualities are well known. In general they fall into one of several categories:

Ion source deposition, wherein an ion source produces ions of the desired material which are then accelerated toward a target substrate by means of a low potential extraction electrode;

Sputtering, by which process a target made of the desired deposition substance is bombarded by ions from an ion beam, thereby releasing quantities of material which coat the deposition target substrate.

Plasma deposition using direct current and conducting substrates, in which ions in a glow discharge produced by DC impressed between the target substrate cathode and an anode are attracted to the cathode and are deposited on its surface, and;

Plasma deposition using an RF source impressed between the target and a second electrode.

The films produced by any of the above methods are superior to those produced by vapor deposition, which process generally results in films having high internal stress and poor adhesion and is confined to films of other than the amorphous structure film here considered. Each of the methods described above have certain disadvantages and limitations, leading to the need for improvement in the processes and apparatuses for producing such films. Thus, some of the above methods suffer from slow film deposit rates, others still from high internal stress in the deposited films and poor adhesion. Direct current plasma deposition is limited to conductive substrates.

The use of RF energy as the means for dissociating and ionizing the gas is taught by Holland, United Kingdom Pat. No. 1582231, wherein it is taught to use an electrode driven by a RF source. If the source is isolated from the surface by a capacitance, which may be the substrate itself, it is thereby rendered self-biasing. The potential of the electrode causes the positive ions produced in a surrounding gas at low pressure to be accelerated towards the electrode and to coat the electrode.

U.S. Pat. No. 4,382,100 teaches the use of a radio frequency source for excitation of a gas which is generally dispersed throughout the volume of the chamber, and alternatively, also the use of a second RF coil which completely surrounds the vacuum chamber and which assists in the dissociation of the gas in the vicinity of the first electrode. The use of a second RF source, as taught by this reference further enhances the dissociation and ionization of the gas in the vicinity of the electrode, but suffers from the drawback that the ions produced by this technique are not confined to the area in which it is desired to accomplish the deposition, but are instead allowed to migrate throughout the entirety of the chamber, and therefore come into contact with the walls of the chamber and other surfaces within the chamber. The result is contamination of the plasma, and impure deposited films. In addition, the efficiency of the process is impaired since deposition may occur on the walls of the chamber as well as on the desired target area. Finally, plasma density and ion energy levels are interdependent in the '100 patent, leading to undesirable trade-offs between film properties and deposition rates.

Accordingly, a need exists for a process and an apparatus for producing such films which results in films of high purity having low internal stress and therefore good adhesion properties, and which allows the build-up of the deposited film thickness at the maximum possible rate consistent with good adhesion and maintenance of the desired diamond-like properties of the film.

SUMMARY OF THE INVENTION

The present invention meets the above-stated objectives by providing an apparatus and a process for deposition of hard carbon films having diamond-like properties. The apparatus comprises a chamber having less than atmospheric pressure, within which are located plasma producing elements including a first electrode, which is an RF oven, and a second electrode which supports the substrate. An electromagnet surrounds the chamber and produces a focusing field for the plasma produced within the first electrode. In the process which employs the apparatus of the present invention, carbon-containing gas, such as methane, is introduced into the first electrode. RF energy applied to the coil excites the gas and causes it to dissociate. A substrate carrier located facing the plasma gun is also excited by radio frequency power applied to the substrate carrier from a second RF source. A substrate upon which it is desired to deposit the films is introduced into the chamber and supported on the substrate carrier. The magnetic field enhances the ionization and dissociation, and as well as confines the plasma into a roughly cylindrical volume between the two electrodes, away from contact with the walls of the chamber and other potentially contaminating surfaces, thereby yielding film deposits having higher purity than other methods. The magnetic field also focuses the plasma onto the substrate thereby building up the film deposits more rapidly than previous methods.

BRIEF DESCRIPTION OF THE DRAWINGS

The FIGURE is a diagrammatic depiction of the deposition apparatus in accordance with the present invention.

DESCRIPTION OF THE PREFERRED EMBODIMENT

Referring now to the FIGURE, there is shown a diagram of the apparatus 10 of the present invention. Vacuum chamber 11 is surrounded by electromagnet 12, the plane of the coil for which is centered approximately mid-way between the first electrode 13 and the second electrode 14. A vacuum pump 55 evacuates the chamber 11 and controls the pressure which is maintained within the chamber 11 during the process.

First electrode 13 comprises cavity 21, closely surrounded by RF coil 22. An opening 24 in the cavity 21 at one end allows a plasma 15 which is formed within the cavity 21 to communicate with the rest of the chamber 11. At the closed end 23 of the cavity, a small orifice 25 allows the introduction of controlled quantities of a gas containing the desired deposition material. For the preferred embodiment, the gas will be described as a carbon-containing gas. Power from the first RF generator 41 is applied to coil 22 which, along with cavity 21, comprises an RF oven. In the preferred embodiment, the cavity 21 is a Pyrex cylinder having one end closed, and surrounded by a coil 22 of several turns.

Second electrode 14 comprises a substrate carrier 31 enclosed by a a shield 32 which is maintained at the potential of the RF return and the chamber 11, usually ground. The substrate carrier 31 may be either conducting or insulating material, depending upon the substrate to be employed. The open end 24 of the pyrex cylinder 21 is preferably directed toward the target substrate 33. The diameter of the second electrode 14 is preferably approximately the same as that of the diameter of the opening 24 of the first electrode 13. In an experimental version, a diameter of 6 centimeters has proven satisfactory. The two electrodes 13 and 14 are preferably spaced approximately 25 centimeters apart, for the electrode dimensions described.

The first RF generator 41 is capable of producing a variable power level signal which may be set to a frequency in the vicinity of a few megahertz. Although the precise frequency is not critical; it must be sufficiently high, which is to say in the megahertz range, so that the gas is dissociated and ionized. Similarly, the power, while not critical must be sufficient for ionization and dissociation of the gas. For methane, in the apparatus described, 2 Mhz. has proven satisfactory, at a power level varying from 20 to 500 watts.

Second RF generator 42 is also capable of producing a variable power level which may be set to a frequency in the vicinity of 2 Mhz. Again the precise frequency is not critical, but it must be sufficiently high, so that it will prevent charging of the substrate within one cycle of the RF cycle. A suitable power level for the apparatus has varied between 20 and 300 watts.

Power from the first RF source is applied to the substrate carrier 31 of the second electrode 14 by means of a conductor 36 which is shielded by shield 32.

Impedance matching networks such as impedance matching network 51 are preferably employed to match the loads presented by the changing plasma impedance to the output of the RF source.

A gas containing the compound which it is desired to deposit onto the substrate is leaked into the cavity 21 by means of a needle valve 28 while the vacuum chamber is maintained at a low pressure in the vicinity of 2–200 mtorr.

In operation, inside the cavity 21 the carbon-containing gas is dissociated and ionized into a plasma 15 comprising the cracking products of the gas. In the case of methane, the products are carbon, hydrogen and C:H compounds.

At the second electrode 14, positive ions and electrons produced by the plasma interact with the potentials applied to and assumed by the carrier 31 and the substrate 33. During part of each cycle of the RF signal applied to the second electrode 14, the surface of the substrate 34 to be coated is positive and therefore attracts electrons. During the negative part of the cycle, the surface attracts the positively charged ions. Since the electrons are much less massive than the positively charged ions, they are attracted to the electrode in much greater numbers during the positive portion of the cycle than are the positively charged ions during the negative portion of the cycle. Due to this effect, the electrode assumes an increasingly negative charge until a condition is established in which the electrode has assumed a negative self-bias which maintains an equilibrium between the number of positive and negative charges which arrive over a complete cycle of the RF signal.

For the positive ions of the plasma to reach the surface of the substrate 33 and to have sufficient energy for the surface to be coated, they must be accelerated towards the surface by the negative charge on the substrate 33 and substrate carrier 31. Accordingly, the reversal of polarity of the field at the surface of the substrate must be sufficiently rapid to keep the surface charged to a fairly high net negative charge with respect to the plasma. Frequencies in the range of 1 to 14 megahertz, for the RF signal applied to the second electrode 14, have been successfully used for this purpose.

Essentially all of the voltage of the second electrode is dropped across a fairly small distance in the immediate vicinity of the surface of the substrate 33, thus producing the high gradient field necessary to accelerate the positive ions to the target. A sufficient supply of positive ions must be maintained in the vicinity of the high gradient field however to allow attraction to the surface when the RF signal is sufficiently negative. These ions are produced, controllably, by the plasma which is produced by the first electrode 13. The substrate surface 34 is thereby bombarded by ions of carbon and hydrogen, gas molecules, and ionized fragments of molecules. Energetic ions reaching the surface of the substrate are deposited on the surface. At the same time, their impact causes the dislodgment of unwanted matter at the surface due to sputtering. Their impact at the surface also results in the implantation of carbon molecules, in a manner analogous to the sputter/post ion bombardment technique.

The phenomenon just described can be produced without the benefit of the magnetic field produced by coil 12, but with results which are substantially less beneficial than those produced with use of the magnetic field. The present invention improves over the prior art in that the plasma produced by the first electrode 13 is confined and is focused into a beam which concentrates the plasma onto the substrate. In the absence of the magnetic field, the plasma would be dispersed throughout the chamber. The apparatus described herein however focuses the plasma by concentrating it into an approximately cylindrical volume defined by the dimensions of the opening 24 of cavity 21 and the substrate carrier 31.

Concentration of the plasma means that more likelihood of collision exists among the plasma particles while still a part of the plasma, and that the ionization and dissociation of the plasma is therefore enhanced. At the substrate 33, higher plasma density means improved film deposition at a more rapid rate.

An additional benefit of magnetic field confinement is that the plasma particles are maintained away from contact with the walls of the chamber and other potentially contaminating surfaces within the vacuum chamber, thereby yielding film deposits having higher purity than is possible using other methods and apparatus.

Although it is known to provide excitation of the plasma produced in the vicinity of the first electrode in an RF driven apparatus by, for example, providing additional RF drive from the exterior of the chamber, as is taught by U.S. Pat. No. 4,382,100, the present invention differs from the prior art in that two distinct areas of plasma are produced which, at sufficiently high excitation, are forced to merge. Thus, a plasma of high intensity is formed within the carbonaceous gas leaked into the first electrode by means of the needle valve 28 and orifice 25. A first plasma may also be formed in the vicinity of the second electrode 14 due to residual gas, or gas which migrates toward the second electrode 14 from the plasma established by the first electrode 13.

When sufficient power is applied to the second electrode 14, ion energies become sufficiently great to allow positive ions to penetrate to the surface of the second electrode, an occurrence which is marked by a sudden increase in current flow between the two electrodes.

Because two distinct regions of plasma formation exist, one of which directly affects ion energies, the other of which controls plasma formation and therefore plasma density with relatively little impact on mean ion energy levels, additional possibilities for control of the deposition characteristics are found to exist.

It is desirable to have the relatively independent control of plasma density and ion energy levels afforded by the present apparatus in order to obtain better control over the properties of the films produced by the process. In the plasma created as described above, both ionized and neutral components of the cracking products of the gas bombard the substrate surface 34. At low plasma densities, the dissociation of molecules in the gas and from ion impact at the substrate will not be sufficient to rupture all C—H bonds which may find their way to the substrate. The film which forms on the substrate under such low plasma density conditions tends to be polymeric, rather than an amorphous carbon film, due to the large number of C—H bonds which remain intact. Higher plasma densities are therefore required in order to rupture all, or substantially all, of the C—H bonds and to achieve the desired film properties associated with amorphous carbon films.

It is also desirable to obtain the highest possible plasma density, consistent with maintenance of amorphous carbon deposited films, in order to obtain the most rapid build-up of the film thickness. For the accomplishment of both of these objectives, the plasma density can be readily increased. But although plasma density can be directly increased by increasing the amount of drive to the second electrode, as RF power to the second electrode is increased, the energy of the ions bombarding the surface is also increased due to the concomitant increase in self-bias which occurs with increased RF drive, to the point at which the newly arrived ions can dislodge those which were previously attached to the surface and, ultimately, to the point at which the films become graphite-like rather than diamond-like. This latter effect occurs due to the fact that the amorphous films described are metastable and can fall to a lower, more stable energy state if the surface temperature is allowed to become too large. Accordingly, there are finite limits beyond which it is counterproductive to increase plasma density by means of increasing the second electrode RF power.

Plasma density can also be increased, in the present apparatus however, by increasing only the amount of RF power delivered to the first electrode 13. As a result of increased ionization and dissociation at the first electrode, there will be a higher population of carbon-containing ions in the vicinity of the second electrode 14 and more opportunity for such ions to be attracted to the surface of the substrate due to interaction with the high gradient field which surrounds the second electrode 14. Increasing the plasma density by increasing the drive to the first electrode does not directly change the self-bias at the second electrode, and therefore does not directly entail an increase in mean energies of the ions arriving at the substrate 33. Even the slight effect on self-bias which results from changing the plasma density by means of electrode 13 can be compensated, if desired, by a slight adjustment of the RF drive to the second electrode in order to bring the self-bias back to its original levels. The present invention differs in this regard from the prior art deposition apparatus and processes wherein a change in plasma density automatically entails an increase in the mean energy of the ions.

The films produced by the present apparatus and method of the present invention are characterized by the diamond-like properties of extreme hardness, extremely low conductivity, low coefficient of friction and optical transparency over a wide range of wavelengths. In addition, and unlike the similar films produced by other processes, the present films are characterized by low internal stress, due primarily, it is believed, to the near total absence of hydrogen in the films.

Hard C-films such as those produced in accordance with the present invention have been used for such diverse applications as: anti-reflection quarter-wave coatings on Ge-optics to enhance the infra-red transmittance; as optical filters on polycarbonate components, and; as electron strippers in heavy ion accelerators. They are also of considerable interest as coatings on the inner walls of plasma fusion vessels Titanium and as hard coatings on metals to provide a low coefficient of friction (coefficients equal to approximately 0.2 for hard C-films on steel surfaces in contact). As the films produced in accordance with the present invention are free from pinholes, and inert when in contact with most acids and solvents, they may also be expected to have chemical uses.

Although a specific embodiment of the present invention has been described, it will be appreciated that the description given is done by way of example and does not limit the scope of the present invention. Other uses of the apparatus and method of the present invention may be made and are expressly contemplated. Again by way of example, other compounds or elements may be deposited by substituting a gas or combination of gases which contain the desired compound or elements for the carbon-containing gas which is described in the preferred embodiment. Silicon bearing gas ($SiH_4$ gases) and Titanium nitride ($Ti(NH_2)_4$, are particularly interesting and important compounds in that they lend themselves to the production of amorphous films which are shown to have better diffusion barrier properties than do their crystalline counterparts.

The apparatus and process may also be utilized to produce etching instead of deposition, by either introduction of a reactive agent, such as hydrogen, oxygen, chlorine or the like, or by increasing the plasma energy by increasing the power at the second electrode.

Each of these suggested variations as well as others which are not mentioned fall within the scope of the present invention which is defined in accordance with the following claims.

What is claimed is:

1. An apparatus for depositing hard carbon films on a substrate comprising:

a chamber for producing a pressure less than atmospheric;

a cavity contained within the chamber, said cavity having an opening communicating with the chamber;

an RF coil, surrounding the cavity;

a first RF source for exciting the RF coil;

a substrate support located within the chamber, said support located opposite the opening in the cavity and oriented such that the surface of the substrate is generally parallel to the opening in the cavity;

means for electrically biasing the substrate support;

means for introducing gases into the cavity;

means for producing a magnetic field having a direction of maximum field intensity which is generally perpendicular to the surface of the substrate; and means for evacuating the chamber.

2. The apparatus of claim 1 wherein the means for biasing the substrate carrier comprises a source of RF power.

3. The apparatus of claim 2 wherein the means for biasing the substrate carrier comprises a source of RF power and means for inhibiting direct current flow between the surface of the substrate and the source of RF power.

4. The apparatus of claim 3 wherein the means for biasing the substrate carrier comprises a source of RF power isolated from the substrate carrier by means of a capacitor.

5. The apparatus of claim 1 wherein the means for producing a magnetic field having an axis generally parallel to the axis between the cavity and the substrate is an electromagnet having coils surrounding the exterior of the chamber.

6. The apparatus of claim 1 wherein the cavity is a high temperature glass cylinder supported in the interior of the chamber.

7. The process for depositing thin films on a substrate, in a chamber having a cavity located in the interior of the chamber for communicating with the chamber through an opening, for creating a plasma within a gas introduced into the cavity, comprising the steps of:

placing the substrate in the chamber supported on a substrate carrier, such that the surface of the substrate is located opposite the opening in the cavity and oriented such that the surface of the substrate is generally parallel to the opening in the cavity;

evacuating the chamber to a pressure less than atmospheric;

introducing into the cavity a gas containing the substance desired to be deposited on the substrate;

exciting the gas within the cavity to produce a plasma;

biasing the substrate carrier to accelerate ions from the plasma to the substrate;

confining the plasma by applying a magnetic field having a direction of maximum field intensity which is generally perpendicular to the surface of the substrate.

* * * * *